United States Patent [19]
Bonis

[11] Patent Number: 5,187,122
[45] Date of Patent: Feb. 16, 1993

[54] PROCESS FOR FABRICATING AN INTEGRATED CIRCUIT USING LOCAL SILICIDE INTERCONNECTION LINES

[75] Inventor: Maurice Bonis, Crolles, France

[73] Assignee: France Telecom Establissement autonome de droit public, France

[21] Appl. No.: 661,522

[22] Filed: Feb. 26, 1991

[51] Int. Cl.[5] .................. H01L 21/283; H01L 21/336
[52] U.S. Cl. .................... 437/200; 437/41; 437/47; 437/60; 437/193; 148/DIG. 19
[58] Field of Search ................ 437/193, 195, 48, 191, 437/200, 52, 919, 60, 47.41, 59, 50; 148/DIG. 19, DIG. 147; 357/67, 71

[56] References Cited

U.S. PATENT DOCUMENTS

| | | | |
|---|---|---|---|
| 4,994,402 | 2/1991 | Chiu | 437/200 |
| 5,013,678 | 5/1991 | Winnerl et al. | 437/52 |
| 5,026,657 | 6/1991 | Lee et al. | 437/47 |

OTHER PUBLICATIONS

"TiSi2 strap formation by Ti-amorphous-Si reaction" J. Vac. Sci. Technol. B 6 (6), Nov./Dec. 1988 pp. 1734–1739, H. J. W. van Houtum et al.

"Kinetics aspects of TiSi2 deposition without silicon consumption" Appl. Phys. Lett. 55 (15) Oct. 9, 1989 pp. 1549–1551, D. Bensahel, et al.

"Development of the Self-Aligned Titanium Silicide Process for VLSI Application" IEEE Journal of Solid-State Circuits Vo.. SC-20 No. 1 Feb., 1985 pp. 61-69, M. E. Alperin et al.

Primary Examiner—T. N. Quach
Attorney, Agent, or Firm—Hayes, Soloway, Hennessey & Hage

[57] ABSTRACT

A process for fabricating a semiconductor device using local silicide interconnection lines make it possible to fabricate an integrated circuit having a plurality of electronic elements disposed on a semi-conductor substrate. The electronic elements are formed on the substrate such that they are grouped into a first region and a second region adjacent to the first region, each of these regions having predetermined conductivities. The first region has a layer of dielectric material disposed upon it with at least one capacitive element disposed on the dielectric layer. The capacitive element includes a first electrode layer and a second electrode layer. The second region has at least one double junction metal-insulator semi-conductor field effect transistor (MISFET) located therein. The MISFET includes at least three regions, a gate region and two active regions, a source region and a drain region. In accordance with the teachings of the present invention, a process is provided whereby one of said two active regions is electrically connected by a first local connection line to the first electrode layer of the capacitive element, a bond pad is disposed on the gate region, a source bond pad is disposed on the source region, a drain bond pad is disposed upon a drain region and a second electrode layer of the capacitive element, simultaneously, in the same formation step. This is advantageously accomplished inter alia by depositing and then etching the silicide of a refractory metal.

12 Claims, 8 Drawing Sheets

PROCESS FOR FABRICATING AN INTEGRATED CIRCUIT USING LOCAL SILICIDE INTERCONNECTION LINES

FIELD OF THE INVENTION

The present invention concerns a method to produce an integrated circuit comprising double junction point MIS transistors, capacitors electrically connected to these transistors and possibly high value resistors for a submicronic fast analog/digital mixed die using local silicide interconnection lines In particular, the invention can be used in applications of nMOS, pMOS and CMOS high density fast type circuits used to process analog and logic signals and in memory circuit applications.

BACKGROUND OF THE INVENTION

More specifically, the invention concerns the production of a circuit comprising MIS transistors and capacitors, especially for amplifier circuits, switched capacity filtering circuits, analog/digital or digital/analog converter circuits and dynamic DRAM memories With these types of circuits, the capacitors are situated on the electric or field oxide insulation zones of the integrated circuit.

In one known analog die, the capacitors are formed by a first film of doped polycrystalline silicon noted poly-1, a thermic oxidation of this silicon film or a CVD oxide deposit and a second film of polycrystalline silicon deposited on the thermic oxide and noted poly-2. In the first polycrystalline silicon film, the gate of the transistors of the integrated circuit is formed. One example of known analog circuits of this type is described in the document FR-A-2 601 817 filed in the name of the Applicant.

In addition, in the document IEEE 1989—Custom Integrated Circuits Conference and entitled "A Submicron Analog, CMOS Technology" by R. W. Gregor and al., 18.5.1-18.5.4, instructions are contained for the embodiment of high value resistors in the poly-1.

The poly-2 used for the embodiment of the capacitors introduces a further level in the structure of the integrated circuits, thus significantly increasing the height of these circuits, which renders it more difficult to embody the stages for levelling (known under the term "planarization") by the dielectric materials used between the various conductive films. This also makes it difficult to reduce the dimensions of the integrated circuits. In fact, the smallest pattern of these circuits, generally constituted by the gate of the transistors, is 1 micrometer.

Moreover, the etching of the poly-2 is delicate, as it is formed from the etching residue at the foot of the poly-1 owing to the abrupt action constituted by the gates of the transistors situated between the lateral electric insulation zones. So as to avoid this residue, a chemical isotropic etching needs to be used, thus resulting in a large dimensional loss on the poly-2.

So as to reduce this dimensional loss, generally a slight thickness of the poly-2 is selected, thus resulting in the embodiment of high value electric resistors for the upper electrodes of the capacitors limiting the operating speed of these circuits.

In one modified method, it is possible to embody the poly-1 of the capacitors before the poly-1 of the gates, the latter then being embodied in the poly-2. In this case, the difficulty of the etching the capacitive elements is to be added to the etching of the gates, the etching residue forming at the foot of the poly-1 capacitors. Now, the etching of the gates is a crucial operation for embodying a submicronic analog die.

In known logic (or digital) dies, on the gates of the transistors and on their source and drain zones, a silicide film of a refractory metal with low resistivity is formed via the reaction of the silicon and a refractory metal. This technique is known as the self-aligned silicide technique and is described in detail in the document IEEE Journal of Solid-State Circuits, vol. SC-20, No 1 February 1985 and entitled "Development of the self-aligned titanium silicide process for VLSI applications" by M. E. Alperin and al., pp. 61-69.

This technique has a certain number of advantages, such as the reduction of the resistance of the gate and the interconnections of these polycrystalline silicon gates (from 25 ohms to 3 ohms/square), thus improving the operating speed of the integrated circuits. In addition, it makes it possible to reduce the resistance of the source and drain zones by embodying silicide bond pads making it then possible to reduce the number of electric contacts on these active zones resulting in an integration density gain.

This silicide film only ensures connections either between the gates or the drains or between the sources, but it does not allow for the embodiment of interconnections between the sources and the drains or between the gates and the active zones (source or drain). In fact, these interconnections are effected after depositing a insulating (dielectric) film on the surface of the circuit and then opening contact openings in this insulating film in a metallic film etched according to the desired patterns; they constitute the first level of interconnections.

This silicide technology is incompatible with known analog dies, as they are unable to correctly oxidize a silicide so as to form silicide/oxide/poly capacitors. Furthermore, if the silicide is formed after the poly-2 is etched, the capacitors would be short-circuited by the silicide.

In addition, there currently exists the technique of producing local interconnection lines (LIL), which is an extension of the silicide technique described above. This technique is described in detail in the document J. Vac. Sci. Technol. B(6), November/December 1988 and entitled "TiSi$_2$ strap formation by Ti-amorphous-Si reaction" by H. J. W. Van Houtum and al., pp. 1734-1739.

It consists of forming silicide interconnections both on the drains and sources of the transistors to be connected and on the thick dielectric (generally LOCOS). This makes it possible to ensure short distance links between the transistors without any interface being provided between the various films and especially being able to mount the electric contacts on the dielectric. It is then possible to reduce the surface of the sources and drains and thus increase the integration density of the circuits.

In addition, this technique has one significant advantage, namely that the opening of electric contact openings in the dielectric covering the transistors and capacitors is rendered much easier In fact, the contact openings are etched in a thick dielectric which is much more uniform than the one used in the analog die, thus facilitating the levelling of the circuits.

As mentioned previously, this technique is incompatible with known analog dies.

SUMMARY OF THE INVENTION

The object of the invention is to provide a method to produce an integrated circuit for a mixed logic/analog die comprising MIS transistors and capacitors and possible high value resistors (400 ohms to 2 kohms/square) making it possible to overcome the drawbacks mentioned above.

The main objective of the invention is to embody capacitors in an analog die so as to be fully compatible with the siliciding of the gates and source and drain zones of the transistors in order to retain in the logic section of the circuit the maximum integration density and maximum functioning speed.

More specifically, the object of the invention is to provide a method to produce a logic/analog integrated circuit on a silicon substrate including one first and one second region adjacent to each other and comprising, in the first region, an electric insulant supporting one capacitor and, in the second region, a double junction point MIS transistor with one of its active zones being electrically connected to a first electrode of the capacitor by an interconnection line, this method consisting of simultaneously embodying in a silicide of a refractory metal i) said interconnection line directly on the active zone and on the first electrode to be connected; ii) the second electrode of the capacitor and iii) the bond pads of respectively the gate, the source and the drain of the transistor.

According to the invention, the analog/logic circuit is an integrated mixed circuit comprising logic sections and analog sections, the capacitors being an integrating part of the analog sections.

This method has a certain number of advantages compared with the prior art. In particular, the quality of the capacitors is excellent and the resistance of the upper electrode or second electrode is extremely low (3 ohms/square instead of 40 to 50 ohms/square in conventional analog technology), thus increasing the speed of the circuits.

In addition, these capacitors are connected directly to the drain and source regions or to the gates of the transistors by extending their electrode without requiring any interface with the metallic interconnection lines. Furthermore, these capacitors do not create any additional relief with respect to the gates of the transistors or more precisely their silicide bond pad.

The method of the invention clearly benefits from all the advantages of the technology relating to local interconnection lines (LIL) and in particular offers a much greater integration density via a reduction of the source and drain surfaces. In fact, this method makes it possible to suppress the electric contact connections on the active zones (sources or drains). This technology further renders it easier to etch contact holes when a levelling dielectric is used. Now, in submicronic dies, the use of this dielectric is virtually essential owing to reduction of the dimensions of patterns.

According to the invention, it is possible to use a large number of refractory metals so as to constitute the silicide, as for example, tungsten, titanium, tantalum, molybdene and zirconium. Preferably, titanium is used.

The $MSi_2$ type silicon film (with M being a refractory metal) may be formed by depositing a film of a refractory metal on the service of the integrated circuit followed by depositing on this metal film some amorphous silicon which is etched so as to form there the pattern of the interconnection line to be embodied between the transistor and the capacitor, as well as the pattern of the second electrode of this capacitor.

Then, under a nitrogen atmosphere, the refractory metal is made to react with firstly the deposited amorphous silicon and secondly the monocrystalline silicon of the subjacent substrate in the drain and source zones, and possibly the polycrystalline silicon of the gate when this gate is made from this material, so as to form the silicide, the refractory metal not having reacted then being eliminated. In this solution, the thickness of the silicide formed is twice stronger on the zones coated by the amorphous silicon (interconnection line and second electrode of the capacitor).

So as to avoid this excess thickness occurring, the silicide film is preferably embodied:

a)—by depositing on the surface of the circuit a polycrystalline silicon film, b)—by etching this silicon film so as to form there the patterns of the interconnection line and of the first electrode of the capacitor respectively, c)—by depositing a first film of a refractory metal on the structure obtained at b), d)—by thermically making the metal react with the subjacent silicon so as to form a silicide at the location of said patterns of this metal, and e)—by eliminating the refractory metal which has not reacted with the silicon.

Similarly and so as to avoid obtaining excessive thickness, the first electrode of the capacitor and the gate of the transistor are embodied in a given conductive film of doped polycrystalline silicon. However, it is also possible to embody these in a metal, such as Al, W, Ti or Mo. In this case, the polycrystalline silicon film for forming the interconnection line between the transistor and the capacitor is etched so as to additionally form there the pattern of the bond pad of the gate of the transistor.

In this implementation, the reaction of the metal with the subjacent silicon so as to form the silicide is effected uniformly over all the zones of the wafer of the integrated circuit. In addition, when annealing is carried out under nitrogen, this is formed from the TiN uniformly over the entire wafer of the integrated circuit thus avoiding the silicide laterally extending onto the electric insulator (field insulant) and thus avoiding any possible short-circuits occurring between the active zones (sources or drains) and the gate of the transistor.

The silicide film $MSi_2$ may also be formed by selectively depositing silicide onto the regions of the circuit where the silicon is exposed. This method is described in the document Appl. Phys. Lett. 55(15), Oct. 9, 1989 and entitled "Kinetics aspects of $TiSi_2$ deposition without silicon consumption" by D. Bensahel and J. L. Regolinin and J. Mercier. This technique has the advantage of consuming very little of the silicon on the wafer. The thickness of the polycrystalline silicon for the LILs may therefore be extremely small (300–400 Å), which further facilitates etching of the poly-2.

The method of the invention further makes it possible to embody a high value resistor allowing an additional integration density gain with respect to convention analog techniques when embodied in the poly-1.

The method of the invention is also advantageously applicable to mixed logic/analog dies with an elementary width of between 0.7 and 0.5 micrometers.

BRIEF DESCRIPTION OF THE DRAWINGS

Other characteristics and advantages of the invention shall appear more readily from a reading of the following description, given by way of illustration and being non-restrictive, with reference to the accompanying drawings on which.

DETAILED DESCRIPTION OF THE PREFERRED EMBODIMENTS

The description which follows concerns the production of a CMOS circuit comprising one transistor with n channels and one double junction transistor with p channels formed in a type p monocrystalline silicon substrate, the transistor with p channels being connected to a capacitor. But of course, as mentioned earlier, the invention is also applicable to nMOS or pMOS circuits formed in a type n silicon substrate. In addition, the capacitor may be connected to a transistor with n channels.

Figure 1:
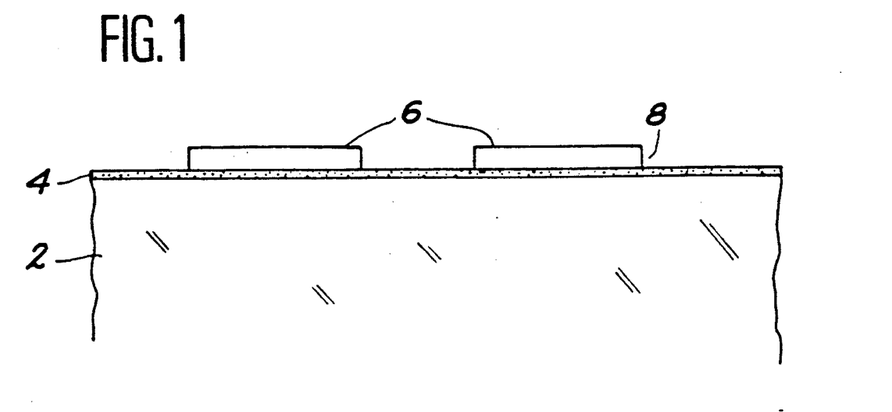
FIGS. 1 to 12 and 14 to 16 diagrammatically show as a longitudinal section the various stages of the method of the invention, FIG. 13 diagrammatically represents one variant of the method of the invention, FIGS. 17 to 19 diagrammatically show another variant of the method of the invention so as to produce a high value resistor, and FIGS. 20 to 22 diagrammatically represent one variant for producing the silicide in accordance with the method of the invention.

The following stages of the method and shown on FIG. 1 concern the definition of the locations and dimensions of the active zones.

First of all, a thin oxide 4 of about 25 nm is formed by known means on a type p monocrystalline silicon substrate 2 by thermic oxidation at 950° C. of the substrate in a dry oxygen atmosphere for 38 min; then a mask 6 of silicon nitride is formed defining the location and dimensions of the transistors, as well as those of the lateral insulators or field oxide to be embodied. This mask 6 comprises openings 8 opposite the electric insulation zones to be formed.

This mask 6 is formed by a low-pressure chemical vapor phase depositing of silicon nitride from $SiH_2Cl_2 + NH_3$ over a thickness of about 90 nanometers for 25 mins followed by an annealing at 1000° C. for 30 mins under nitrogen, followed by the embodiment of an ionic plasma etching reacting with $SF_6 + O_2$ through a positive resin photomask (not shown) masking the portions of the $Si_3N_4$ to be retained.

Figure 2:
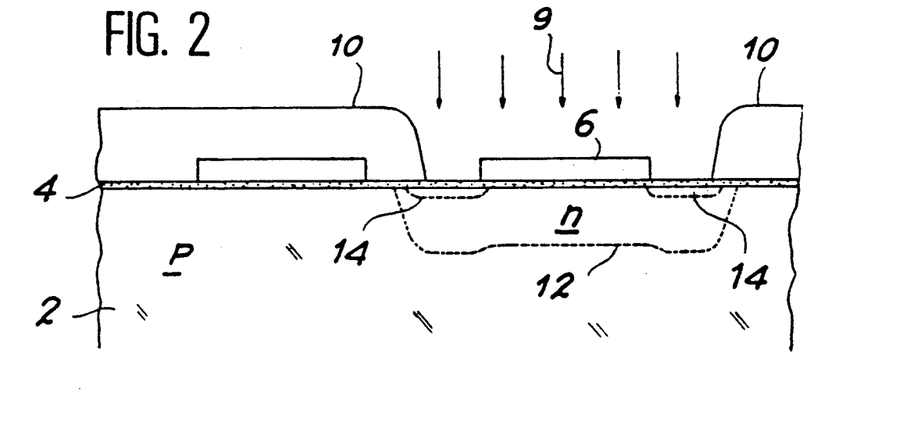

The following stages shown on FIG. 2 concern the embodiment of a type n body.

A resin photomask 10 is then formed defining the location and dimensions of the type n body 12 in which the transistor with p channels is to be embodied. This body 12 is obtained by implanting phosphorus ions at a dose of $3.3.10^{12}$ atoms/cm2 and an energy of 180 keV.

An additional implantation of arsenic ions at a dose of $7.10^{11}$ atoms/cm2 and an energy of 50 keV creates pierce-proof zones 14 on both sides of the silicon nitride 6 masking the region of the transistor with p channels to be embodied.

The arrows 9 symbolize these two implantations.

After annealing of the resin 10 by oxygen plasma, the structure is annealed at 1200° C. under nitrogen for 125 minutes.

Figure 3:
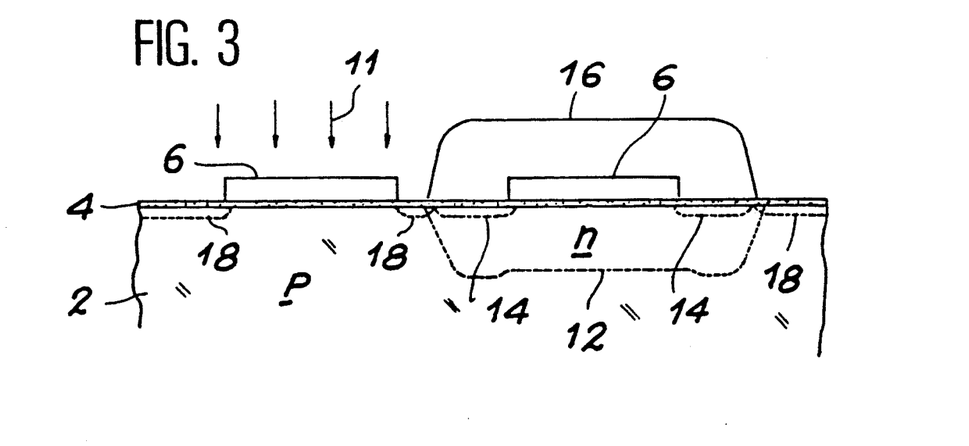
Figure 4:
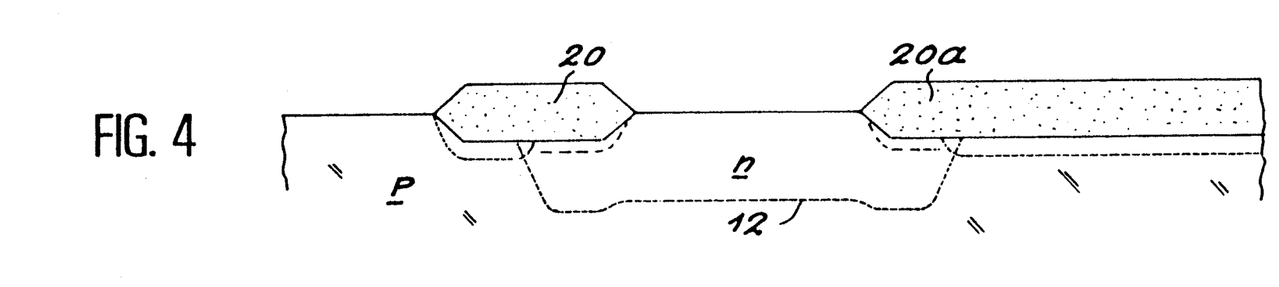

The following stages shown on FIGS. 3 and 4 concern the embodiment of the field oxide.

With the aid of the resin photomask 16 masking the body n (FIG. 3), an ionic implantation 11 of $BF_2$ is effected at a dose of $2.10^{13}$ atoms/cm2 and an energy of 45 keV resulting in doped insulation zones 18 on both sides of the silicon nitride 6 masking the region of the channel n transistor to be formed in the type p region of the substrate.

After removal of the resin 16 with an $O_2$ plasma, as shown on FIG. 4, a localized oxidation of the substrate is carried out, thus resulting in the formation of a field oxide dielectric layer or LOCOS 20, 20a. This oxidation is effected at 1050° C. under an atmosphere of oxygen, hydrogen and HCl on a thickness of 710 nm ±25 nm. The region 20a corresponds to the electric insulator intended to support the capacitor.

Next, the nitride mask 6 and the oxide formed on the latter is eliminated at the time of thermically oxidizing the substrate and the oxide 4. To this effect, the oxide is etched with the aid of a "BOE" (Buffered Oxide Etching) (fluorhydric acid and ammonium fluoride) for 2 mins 15 secs, then the silicon nitride is etched by hot orthophosphoric acid at 145° C. for 45 mins, followed by an etching of the oxide 4 via BOE for 1 min 30 secs.

Then the active zones (zones of the substrate and intended for the transistors) are re-oxidized giving rise to a sacrificial film of oxide; this re-oxidation is effected at 1000° C. in an oxygen and hydrogen atmosphere on a thickness of about 60 nanometers and then the active zones are deoxidized by a BOE etching for 4 mins.

Figure 5:
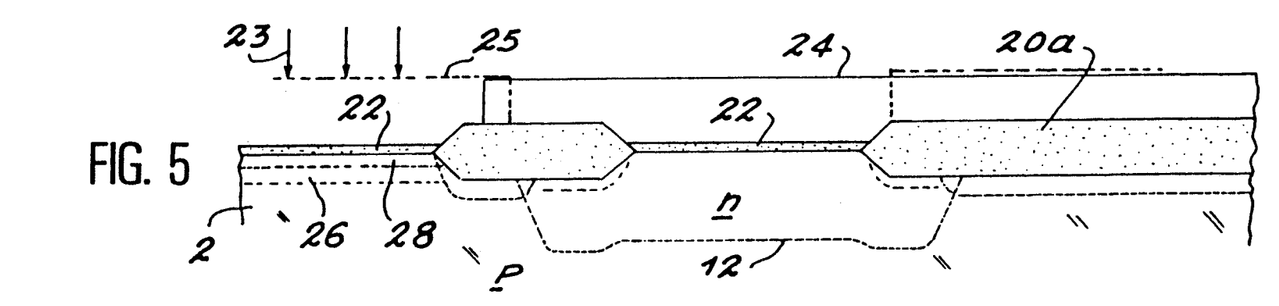

The following stages shown on FIG. 5 concern the formation of the gate oxide and the adjustment of the threshold voltages of the transistors.

First of all, the active zones are oxidized at 950° C. under a dry oxygen atmosphere for 28 mins resulting in the gate oxide 22 with a thickness of 20 nm; then a resin photomask 24 is embodied masking the substrate region for the channel p transistor and in particular the body n 12. This photomask 24 is further used to mask the insulator 20a intended to support the capacitor.

Then a pierce-proof ionic implantation is effected in the region intended for the n transistor of the integrated circuit with boron ions at a dose of $8.10^{11}$ atoms/cm2 and an energy of 100 keV. This doping is symbolized by the dotted lines 26 in the region p of the substrate, then another ionic boron implantation is embodied at a dose of $2.10^{11}$ atoms/cm2 and with an energy of 25 keV to adjust the threshold of the transistor n. This threshold adjustment doping is symbolized by the dotted lines 28 in the region p of the substrate.

The arrows 23 symbolize these two successive implantations.

After removal the resin 24 with an oxygen plasma, an adjustment implantation n and p is effected in the entire integrated circuit, this consisting of implanting boron ions at a dose of $6.10^{11}$ atoms/cm2 and an energy of 25 keV.

With the aid of a resin threshold adjustment photomask 25 shown by the dotted line and masking the region intended for the transistor n and the insulator 20a, boron ions are implanted at a dose of $2.10^{11}$ atoms/cm2 and an energy of 25 keV in the substrate region for the analog transistor with p analog channels (low VT) and in particular in the body n. Then this photomask 25 is eliminated with an oxygen plasma.

This operation is optional. It is only effected on certain channel p transistors so as to lower the threshold voltage for certain analog applications.

Figure 6:
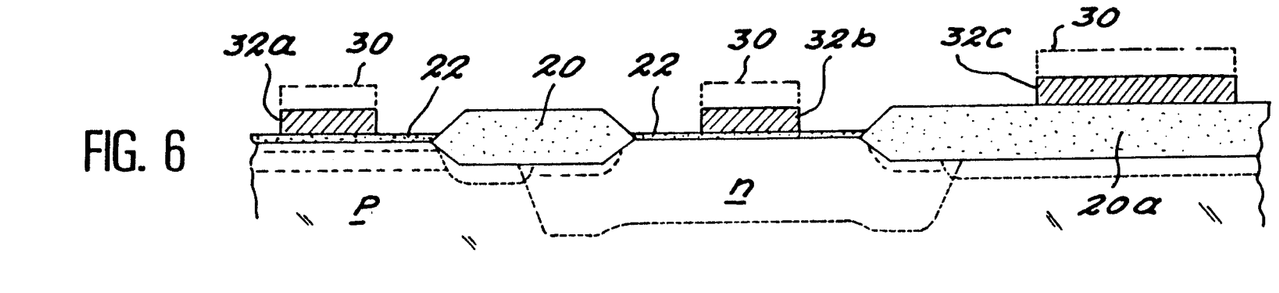

The following stages of the method concern the depositing and etching of the first conductive film, as represented on FIG. 6.

To this effect, a polycrystalline silicon film is deposited via LPCVD at 600° C. with a thickness of 380±25 nm on the entire surface of the integrated circuit, then this silicon is doped by implanting in it phosphorus ions at a dose of $10^{16}$ atoms/cm2 and an energy of 65 keV and annealing is carried out at 800° C. for 30 mins under a nitrogen atmosphere.

Then a photomask 30 is embodied defining the location and dimensions of the gates of the transistors and the location and dimensions of the first electrode (or lower electrode) of the capacitor. Then an anisotropic ionic plasma type etching is effected reacting with the $CF_4+Cl_2$ or an equivalent etching chemistry, the gate insulator 22 serving as a stop for this etching. Thus, a gate 32a and 32b respectively is obtained from the channel n and p transistors and the lower electrode 32c of the capacitor situated above the field oxide 20a.

Figure 7:
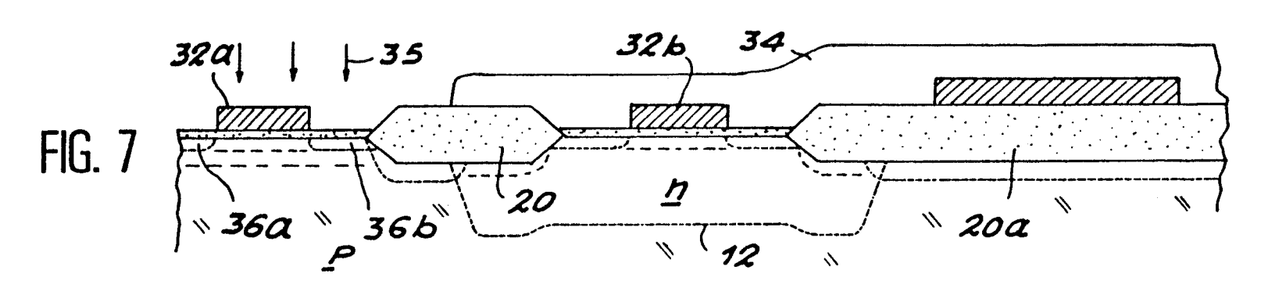
Figure 8:
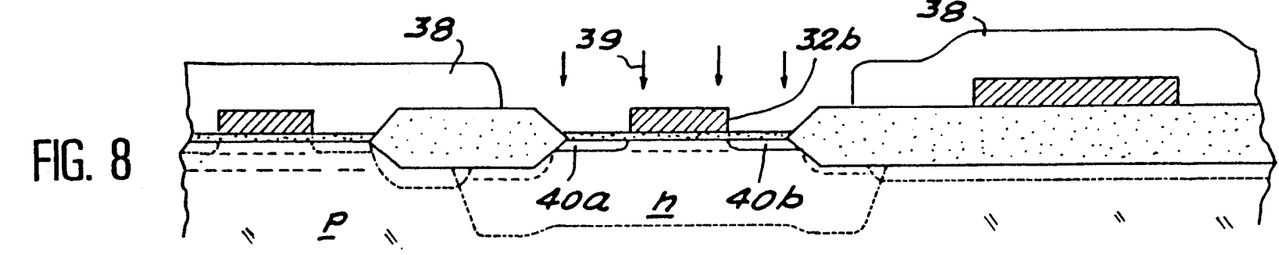

The following stages concern the embodiment of the slightly doped junction points n and p, as shown on FIGS. 7 and 8.

After eliminating the etching mask of the gates 30 via oxygen plasma, a new photomask 34 is embodied (FIG. 7) identical to the photomask 24 and masking the region of the integrated circuit intended for the channel p transistor and in particular the body 12, as well as the field oxide 20a supporting the capacitor. Then arsenic ions 35 are implanted at a dose of $2.10^{13}$ atoms/cm2 and an energy of 180 keV, thus resulting in the formation of type n regions 36a and 36b on both sides of the gate 32a of the n channel transistor, which shall partly constitute the source and drain of this transistor; the gate 32a also serves as a mask for this implantation.

After eliminating the resin 34 by oxygen plasma, a new resin photomask 38 is embodied, as shown on FIG. 8, masking the region of the integrated circuit intended for the channel n transistor, as well as the location for the capacitor. With the aid of this photomask 38, boron ions 39 are implanted at a dose of $10^{13}$ atoms/cm2 and an energy of 25 keV so as to form firstly two type p regions 40a and 40b and secondly the gate 32b of the channel n transistor. Then the photomask 38 is eliminated by oxygen plasma.

Figure 9:
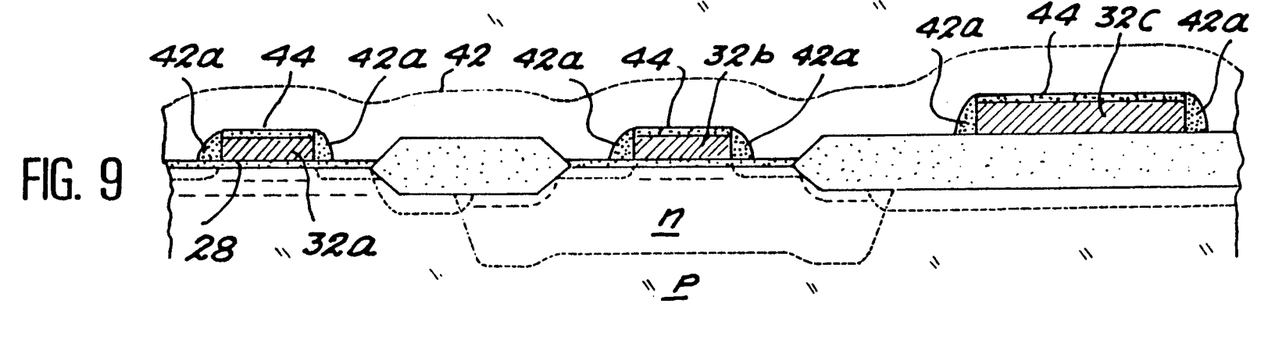

The following stages concern the formation of spacers and the oxidation of the gates of the transistors and the electrode of the capacitor, as shown on FIG. 9.

As shown by the dots, first of all a film of silicon oxide 42 is deposited by a plasma chemical vapor phase depositing on a thickness of 400 nm, this oxide not being doped. Then a full flat anisotropic etching is effected on the film 42 with a $CHF_3$ plasma and a stoppage of etching on the polycrystalline silicon of the gates 32a and 32b and the lower electrode 32c of the capacitor.

Thus, insulating spacers 42a are obtained on the lateral portions (flanks) of the gates 32a and 32b and the flanks of the electrode 32c of the capacitor. The width of these spacers depends on the thickness of the oxide 42 deposited.

Next, the polycrystalline silicon of the gates 32a and 32b and of the electrode 32c of the capacitor are oxidized at 900° C. in a stream vapor and oxygen atmosphere over a thickness of 45 nm.

The following stages of the method concern the delimitation of the dielectric insulator of the capacitor, as well as the embodiment of the patterns of the interconnection line between the transistor and the capacitor and the upper electrode of the silicide capacitor in accordance with the invention.

So as to simplify the drawings, only the transistor and the capacitor to be connected are shown on FIGS. 10 to 15.

Figure 10:
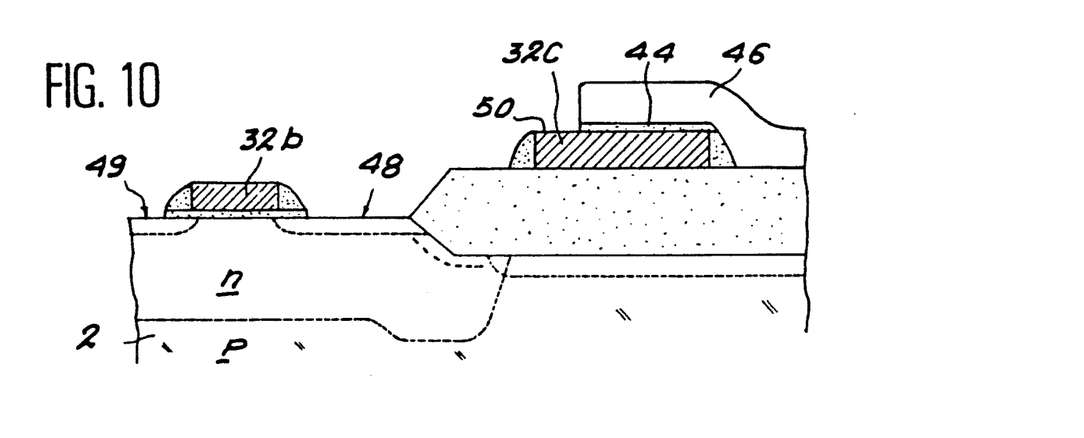

As shown on FIG. 10, first of all a resin photomask 46 is embodied fixing the dimensions of the insulator of the capacitor to be molded. To this effect, the photomask 46 only masks the capacitor oxide region 44 which shall support the second silicide electrode.

Then the non-masked oxides 28 and 44 are etched. This etching is a reactive ionic etching using $CHF_3$ plasma. Thus, it makes it possible to deoxidize the zones to be silicated, such as the gate (32b)(32a), the drain 48 and the source 49 to the p channel transistor, as well as the zone 50 of the electrode 32c of the capacitor intended to take up electric contact of the interconnection line to be embodied.

Figure 11:
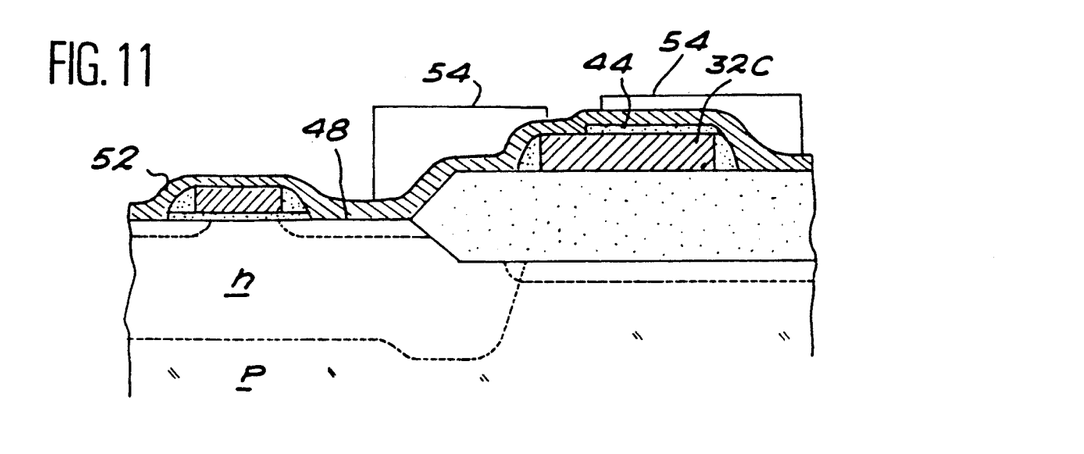

Then, as shown on FIG. 11, a non-doped film of polycrystalline silicon 52 is deposited on the surface of the integrated circuit having a thickness of between 50 and 150 nm. This film 52 is deposited via LPCVD at 600° C. Then a new resin photomask 54 is embodied fixing the dimensions and location of the local connection to be embodied between the drain 48 of the p channel transistor and the first electrode 32c of the capacitor, as well as the location and dimensions of the second electrode of the capacitor.

Then the film 52 is etched so as to eliminate from it the non-masked regions, the end of attack detection being effected on the field oxide dielectric layer of the circuit. This etching needs to be sufficiently isotropic so as to avoid forming too much residue at the working foot. It needs to be selective so as to avoid hollowing the silicon too much in the source and drain regions. To this effect, a plasma etching is used with $SF_6$ as an attack agent and with a selectivity of about 4.

Figure 12:
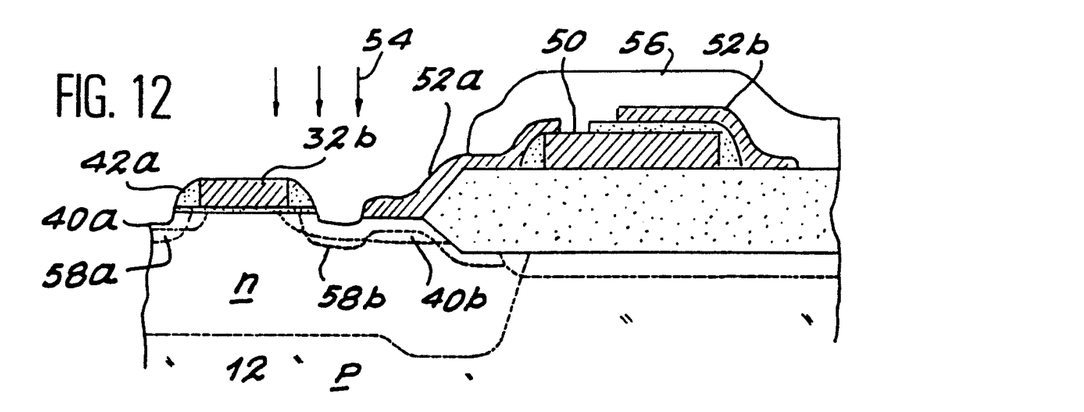

After etching, the structure obtained is shown on FIG. 12. The references 52a and 52b respectively indicate the patterns of the interconnection line and of the second electrode to be embodied.

The following stages concern the production of sources and drains.

After the photomask 54 has been eliminated with an oxygen plasma, a new resin photomask 56 is embodied masking the substrate region for the n channel transistor, as well as the location of the capacitor to be embodied.

With the aid of this photomask 56, a high dose source and drain implantation 57 is effected in the substrate region for the p channel transistor and thus in the body n 12 so as to form two implanted regions 58a and 58b, thus constituting the double joint source 49 and drain 48 of the transistor p. This implantation is effected by using the dielectric spacers 42a and the grid 32b as an implantation mask. It is effected with arsenic ions at a dose of $10^{15}$ to $10^{16}$ atoms/cm2 and with an energy of 100 to 180 keV.

Figure 13:
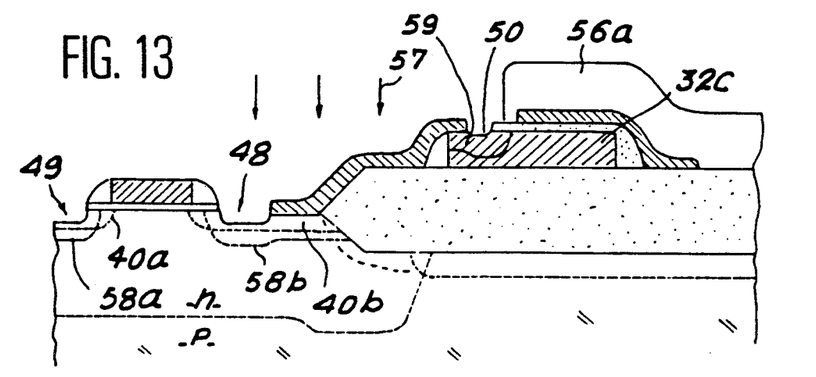

The implantation mask 56 of FIG. 12 covers the entire region for the capacitor, as well as the contact zone 50 of the capacitor. It is also possible to embody a photolithoetching mask 56a only masking the capacitor zone for the second electrode and, of course, the substrate region for the transistor with n channels. In these conditions, the arsenic implantation 57 introduces a local doping 59 into the contact zone 50 of the electrode 32c of the capacitor. This doping zone 59 makes it possible to obtain excellent contact on the electrode.

Then the photomask 56 is eliminated with an oxygen plasma.

The designer has the option of having the Si poly of the LIL possibly receiving an As implantation, a boron implantation or no implantation. Preferably the implantation is selected as being of the same type as the zone D or S where the LIL is connected. The implanted regions N+ shall be separated from the regions P+ by a non-implanted region, as well as the regions to be used for the embodiment of high value resistors.

Parallel with the arsenic implantation, an ionic implantation of $BF_2$ is effected at a dose of $10^{15}$ to $10^{16}$ atoms/cm2 and with an energy of 180 keV in the region of the integrated circuit for the p channel transistor by using a photomask (not shown) identical to the mask 34 masking both the region of the n channel transistor and that of the capacitor.

This type n or p high dose drain and source implantation traverses the polycrystalline silicon 52a partly covering these active zones.

Then after removal of the photomask from the side n, an annealing is carried out between 950° and 1100° C. for 5 to 60 seconds to activate the source and drain regions.

The following stages of the method consist of forming the gate, source and drain bond pad, as well as the local interconnection line and the second electrode of the silicide capacitor.

Figure 14:
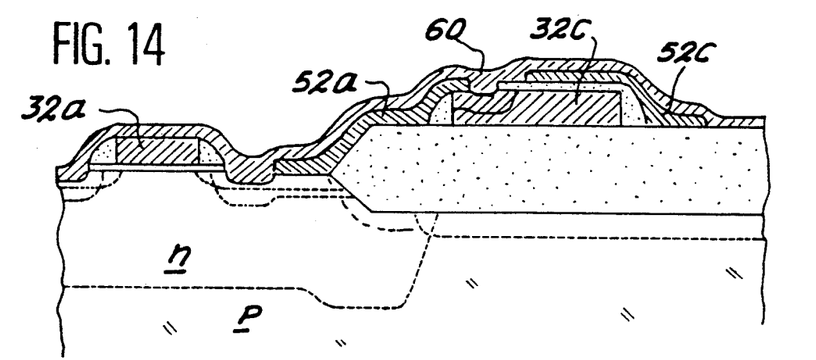

As shown on FIG. 14, the next stage consists of depositing on the surface of the integrated circuit a film of titanium with a thickness of 80 nm by means of spraying. Then a fast annealing at 700° C. is effected in a nitrogen atmosphere for 50 seconds so that the titanium reacts with the polycrystalline silicon 52a, 52b, 32c and 32a, as well as the monocrystalline silicon in the source and drain regions of the transistor so as to form the $TiSi_2$.

A film of TiN is formed on the surface of the titanium by virtue of the titanium reacting with the nitrogen. The role of this film is to limit the $TiSi_2$ laterally extending onto the oxide 44 of the capacitor and onto the spacers 42a, thus allowing for good electric insulation between the gate of the transistors and their source and drain regions. This insulation amounts to about 0.3 micrometers, which corresponds to the width of the spacers.

Then the titanium is selectively removed which has not reacted with the silicon, and the TiN in a 50% volume liquid ammonia and oxygenated water bath for 30 mins, followed by an annealing of the silicide at 900° C. for 20 seconds.

Figure 15:
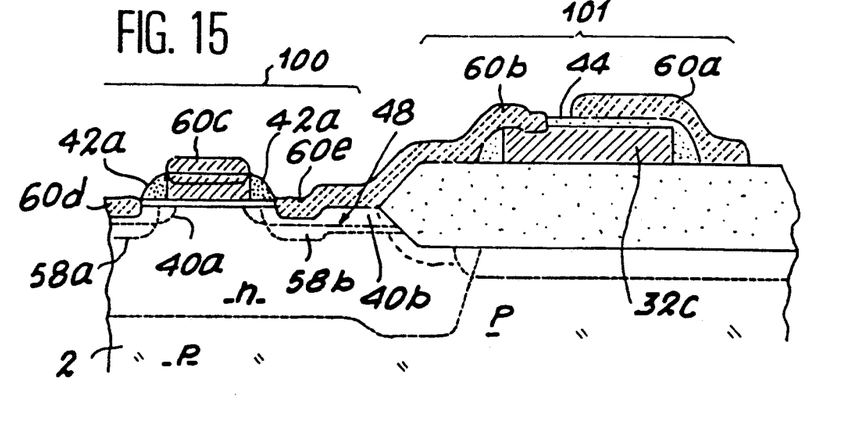

According to the invention as shown on FIG. 15, the second electrode 60a of the capacitor 101, the interconnection line 60b between the drain 48 of the transistor 100 and the electrode 32c of the capacitor, the bond pad 60c of the gate 32b, the bond pad 60d of the source 49 and the bond pad 60e of the drain are all embodied.

Figure 16:
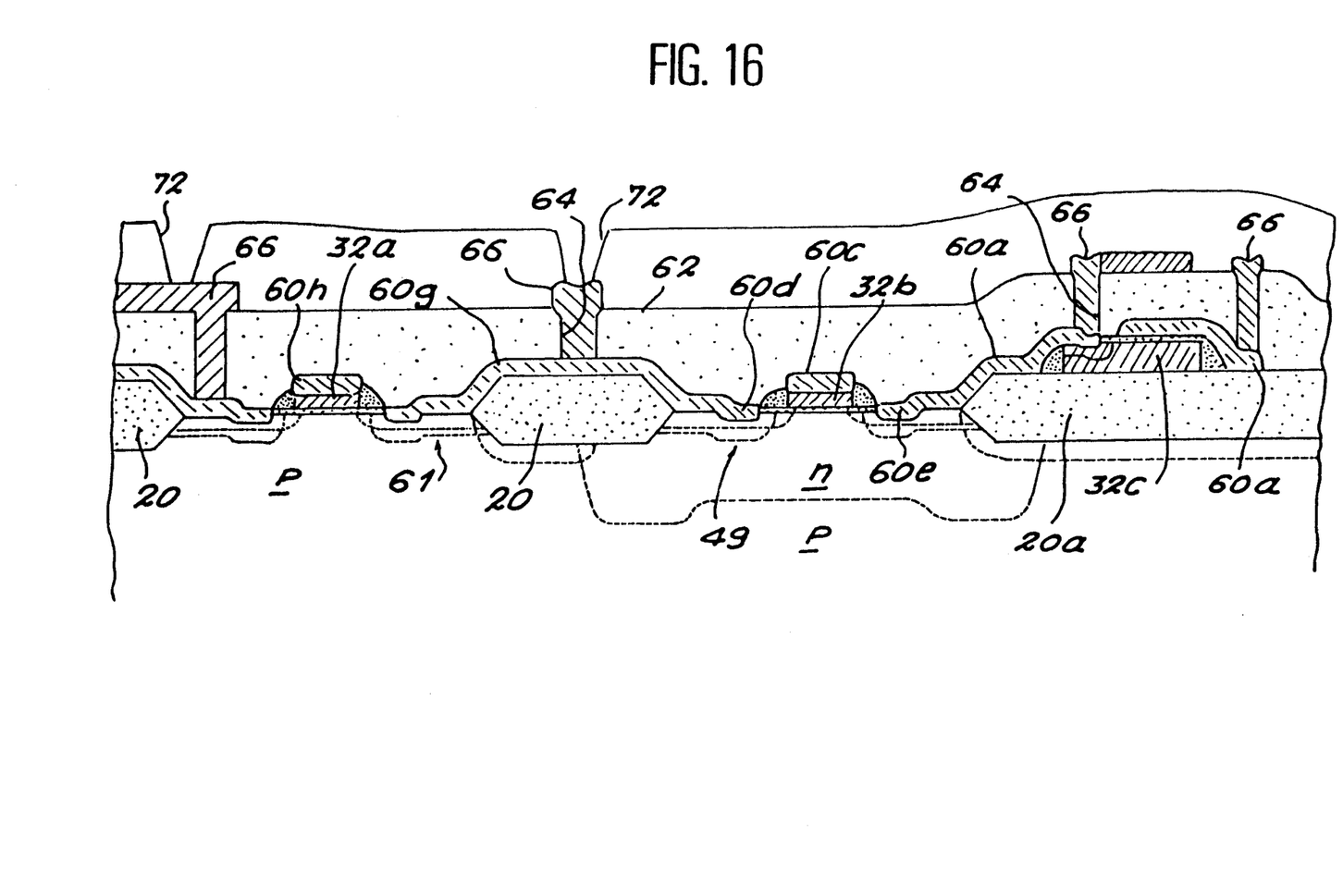

Similarly and as described above with reference to FIGS. 11 to 15, it is possible to embody a local interconnection line 60g between the source 49 of the p channel transistor and the drain 61 of the n channel transistor, as well as the bond pad 60h of the gate 32a of the n channel transistor, as shown on FIG. 16.

The following stages concerning the depositing of the first levelling dielectric and the formation of contact openings in this dielectric.

To this effect, a film of silicon oxide 62 is deposited on the surface of the integrated circuit by means of PECVD from tetra-ethyloxysilane (TEOS) at 480° C., this film being constituted by alternate non-doped films and films doped with 3.5% phosphorus on a thickness of 500 nm, including 400 nm for the doped oxide. This deposit is followed with partial anisotropic etchings, thus avoiding the operation for flowing of the oxide conventionally carried out at a high temperature which would adversely affect the integrity of the $TiSi_2$. Thus, a insulting film is obtained which partly levels the surface of the integrated circuit.

The following stages are identical to those of the prior art.

Contact openings 64 are ionic plasma etched reacting with the $CHF_3$ after having embodied a photomask (not shown) on the surface of the circuit defining the location of these contact openings and their dimensions. Then a film of metal, such as in particular tungsten, with a thickness of 500 nm is deposited by cathodic evaporation or preferably by CVD. The CVD depositing of the tungsten ensures the complete filling of contact openings with a width smaller than one micrometer.

With the aid of a photomask (not shown), a reactive ionic anisotropic etching is made of the metallic film, thus embodying the taps of contact 66 of the drain and source regions and on the electrode 60a of the capacitor.

The method of the invention makes it possible to suppress the contact taps on the source and drain zones and of embodying the latter on the field oxide 20 or 20a, thus increasing the integration density of the circuits and facilitating the embodiment of contact openings 64 in the insulator 62. Moreover, this method allows for a continuity of the $TiSi_2$ interconnection lines 60b or 60g with the monocrystalline silicon in the drain and source regions owing to the high dose implantation of these sources through the etched polycrystalline silicon film used for embodying the silicide.

The next stage of the method consists of depositing a new film of non-doped silicon oxide, referenced 70, 800 nm thick by PECVD on the unit of the circuit and of then embodying in this oxide film 70 viaducts 72 by plasma etching with $CHF_3$ by using a suitable photomask, and finally of embodying by known means the second interconnection line in metal of the integrated circuit above the viaducts.

The method of the invention is also applicable to the embodiment of analog/logic integrated circuits comprising high value resistors. The modifications to be made described above are represented on FIGS. 17 to 19.

According to the invention, the embodiment of high value resistors occurs when embodying the second electrode of the capacitor after depositing the polycrystalline silicon film 52 (FIG. 11) and etching of this film with the aid of a suitable photomask, such as 54, masking also the zone 52c of the silicon film intended to embody a high value resistor.

Figure 17:
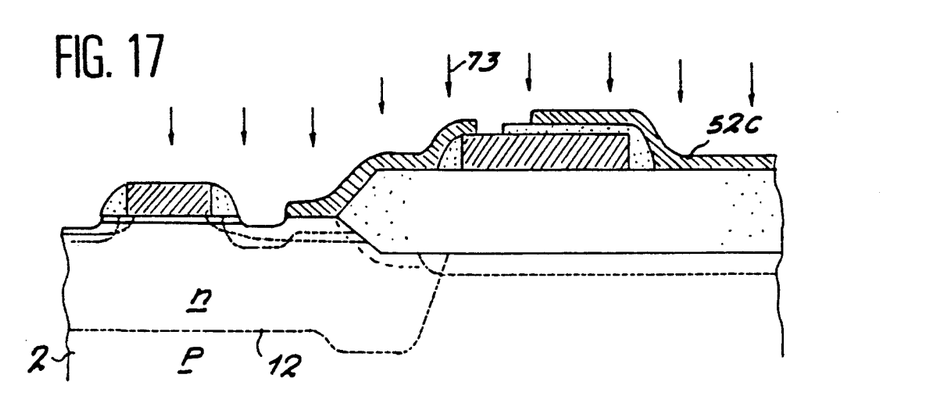

After the isotropic etching of the silicon film 52, arsenic ions 73 are implanted, as shown on FIG. 17, with an energy of 40 keV and at a dose of from 1 to $5.10^{14}$ atoms/cm2 according to the value of the desired resistance (from 400 ohms to 2 ohms/square). This implantation 73 is effected throughout the entire integrated circuit.

Then a thin non-doped film of silicon oxide is deposited by TEOS with a thickness of between 40 and 80 nm over the entire structure.

Figure 18:
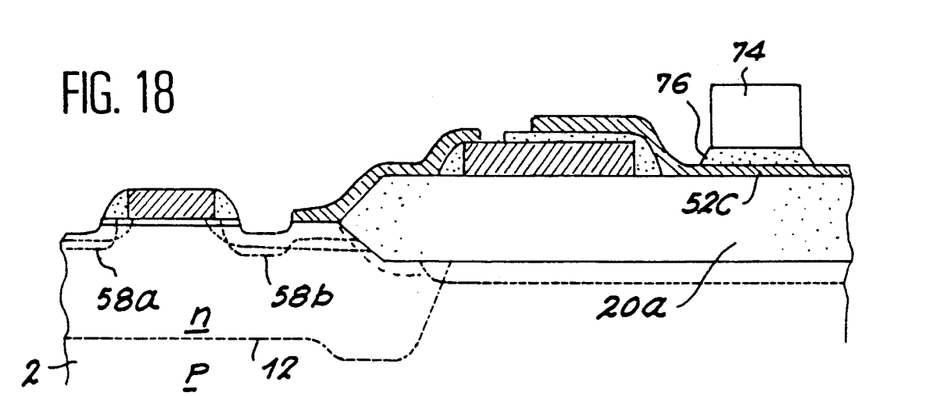

After embodying a resin photomask 74 intended to mask the section of the silicon film 52c in which the high value resistor is embodied, a reactive ionic etching of the oxide is effected with a plasma. Thus, an oxide vignette 76 is obtained, which locally protects the silicon section 52c, which shall not be silicided during the subsequent stages.

After the embodiment of this oxide vignette 76 and elimination of the photomask 74, the source and drain regions 58A and 58b are formed, followed by depositing of the titanium with a view to forming the TiSi$_2$ by annealing under nitrogen.

Figure 19:
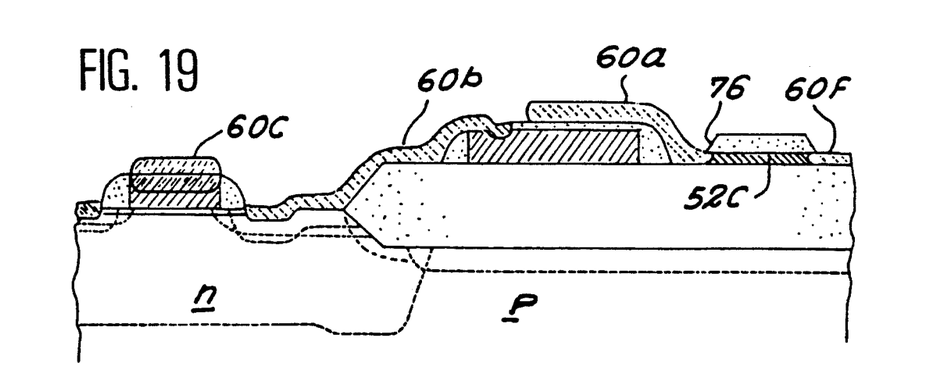

After the silicide has formed, the structure shown on FIG. 19 is obtained.

The extremities of the high value resistor 52c are silicided and connected directly by local interconnection lines, such as 60f, to the gates, drains, sources or capacitors of the circuit, or by a tap at the level of the first metallization (66, FIG. 16). FIG. 19 shows the resistor 52c having one of its terminals connected directly to the electrode 60a of the capacitor.

Figure 20:
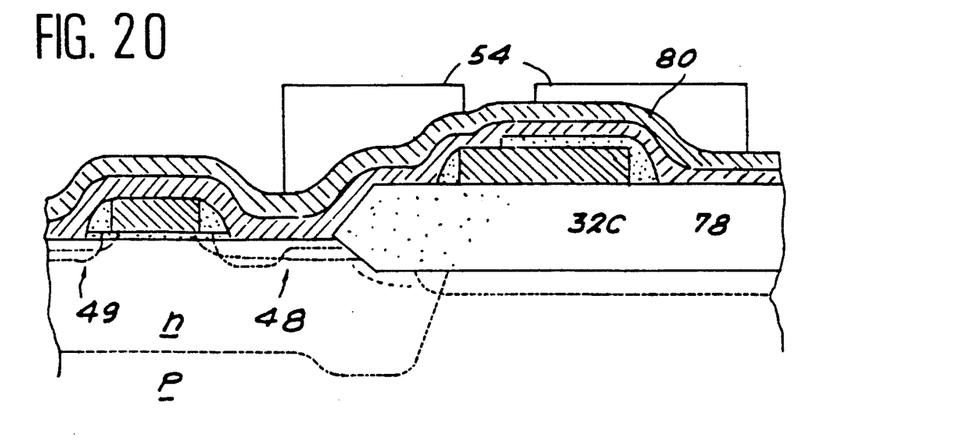
Figure 21:
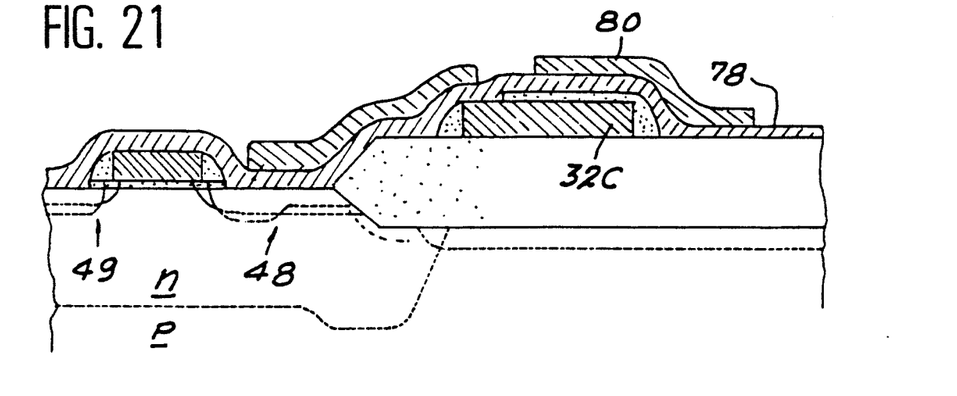
Figure 22:
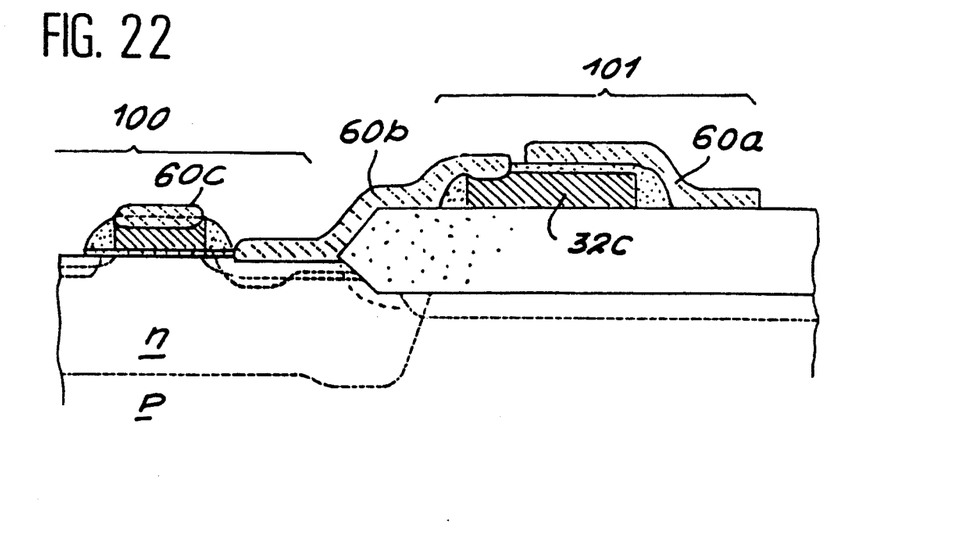

FIGS. 20 to 22 show one variant for embodying the silicide in accordance with the invention. These modifications appear following the stages described with reference to FIG. 10.

In this variant, a film of titanium 78 with a thickness of 80 nm is deposited on the entire structure by spraying and then a film of amorphous silicon 80 is sprayed over the entire film of titanium 78. These deposits are effected in the same frame.

Then the photomask 54 is formed fixing the dimensions of the local interconnection line between the drain 48 of the transistor and the electrode 32c of the capacitor, as well as the dimensions of the second electrode of the capacitor.

Then, as shown in FIG. 21, the silicon film 80 is etched according to an ionic anisotropic etching reacting with the SF$_6$.

After the photomask 54 has been eliminated with an oxygen plasma, a fast annealing at 700° C. under a nitrogen atmosphere is carried out so that the silicon 80 reacts with the subjacent titanium so as to form the armature 60a and the local TiSi$_2$ interconnection line. Moreover, some TiSi$_2$ forms on the polycrystalline silicon zones of the gates and from the monocrystalline silicon of the active zones in contact with the titanium 78.

Next, the titanium which has not reacted is eliminated. The final structure is the one shown on FIG. 22.

What is claimed is:

1. A process for fabricating an integrated circuit having a plurality of electronic elements disposed on a semiconductor substrate, said plurality of elements of said integrated circuit being formed on said substrate such that said elements are grouped into a first region and a second region, said first and second regions being adjacent to each other on said substrate and each having predetermined conductivities, said first region of said integrated circuit having a layer of dielectric material located therein with at least one capacitive element disposed on said layer of dielectric material, said at least one capacitive element including a first electrode layer and a second electrode layer, said second region of said integrated circuit having at least one double junction metal-insulator-semiconductor field effect transistor (MISFET) located therein, said at least one MISFET including a gate region, and two active regions, a source region and a drain region, one of said two active regions being electrically connected by a first local connection line to said first electrode layer of said capacitive element, said gate region having a gate bond pad disposed thereon, said source region having a source bond pad disposed thereon, and said drain region having a drain bond pad disposed thereon, said process comprising forming a layer of a silicide of a refractory metal and etching said silicide layer to simultaneously form said first connection line, said gate bond pad, said source and drain bond pads, and said second electrode layer of said capacitive element.

2. A process according to claim 1, wherein said refractory metal comprises a titanium composition.

3. A process according to claim 1, wherein the formation and etching of said silicide layer comprises:
 (i). depositing a polycrystalline silicon film;
 (ii). etching said polycrystalline silicon film such that said connection line and said second electrode of said capacitive element are thereby embodied;
 (iii). depositing a first refractory metal film;
 (iv). thermally reacting, in a nitrogen atmosphere, said refractory metal film deposition with subjacent silicon, thereby forming said silicide layer; and
 (v). removing non-reacted refractory metal film.

4. A process according to claim 1, wherein the formation and etching of said silicide layer comprises:
 (i). depositing a polycrystalline silicon film;
 (ii). etching said polycrystalline silicon film such that said connection line and said second electrode of said capacitive element are thereby embodied;
 (iii). selectively depositing said silicide of refractory metal such that said connection line and said second electrode are covered thereby.

5. A process according to claim 1, and comprising the steps in sequence of:
 a. forming said dielectric layer in said first region of said substrate;
 b. covering said gate region with a gate oxide layer;
 c. depositing a first layer of conductive film on said dielectric layer and said gate region;
 d. etching said first conductive layer such that said first electrode layer is formed thereby and said gate region remains covered with said first layer thereby forming a gate, said first electrode layer having sides and a first outward surface, said first outward surface facing away from said dielectric layer, said gate having a second outward surface, said second outward surface facing away from said gate oxide layer;
 e. implanting a first type of ions within said second region, said first type of ions having a conductivity that is opposite the predetermined conductivity of said second region, thereby forming said source and drain junction regions;
 f. covering said gate region and said first electrode with a first insulative layer;
 g. etching said first insulative layer such that only a predetermined portion of said first outward surface of said first electrode layer and said second outward surface of said gate are thereby exposed, the exposure of said predetermined portion of said first electrode layer thereby forming a contact opening;

h. depositing a second insulative layer on said first electrode;

i. implanting a second type of ions within said second region, said second type of ions having said opposite conductivity;

j. locally etching said second insulative layer such that said contact opening is exposed; and k. forming said silicide layer of a refractory metal and etching said silicide to simultaneously form said first connection line, said gate bond pad, said source and drain bond pads, and said second electrode layer of said capacitive element.

6. A process according to claim 5, and comprising the steps of implanting said second type of ions in said first electrode at said contact opening.

7. A process according to claim 5, wherein the formation and etching of said silicide layer comprises:

(i). depositing a polycrystalline silicon film;

(ii). etching said polycrystalline silicon film such that said connection line and said second electrode of said capacitive element are thereby embodied;

(iii). selectively depositing said silicide of refractory metal such that said connection line and said second electrode are covered thereby.

8. A process according to claim 5, wherein said formation and etching of said silicide layer at step k comprises:

(i). depositing a polycrystalline silicon film, said polycrystalline silicon film substantially filling said contact opening;

(ii). etching said polycrystalline silicon film such that said connection line and said second electrode of said capacitive element are thereby embodied;

(iii). depositing a first refractory metal film;

(iv). thermally reacting, in a nitrogen atmosphere, said refractory metal film deposition with subjacent silicon, thereby forming said silicide layer; and (v). removing non-reacted refractory metal film.

9. A process according to claim 8, wherein said second type of ions is implanted after the deposition of said polycrystalline silicon film.

10. A process according to claim 8, wherein said plurality of electronic elements includes a resistive element disposed on said layer of dielectric material, said resistive element being electrically connected to said MISFET and to said capacitive element through at least one second connection line, said second connection line being made of said silicide of metal, and including the step of etching said silicide layer to form said second connection line simultaneously with the formation of said first connection line, said second electrode layer, and said gate, source, and drain bond pads.

11. A process according to claim 10, and comprising the steps in sequence of:

(i). further etching said polycrystalline silicon film to form said resistive element; and (ii). covering said resistive element with a protective insulative layer prior to said deposition of said first refractory metal film.

12. A process according to claim 11, wherein said conductive film is made of a doped-polycrystalline silicon composition.

* * * * *